(12) United States Patent
Wang et al.

(10) Patent No.: US 11,876,071 B1
(45) Date of Patent: Jan. 16, 2024

(54) SYSTEM-ON-WAFER STRUCTURE AND FABRICATION METHOD

(71) Applicant: ZHEJIANG LAB, Zhejiang (CN)

(72) Inventors: Weihao Wang, Hangzhou (CN);
Shunbin Li, Hangzhou (CN);
Guandong Liu, Hangzhou (CN);
Ruyun Zhang, Hangzhou (CN);
Qinrang Liu, Hangzhou (CN);
Zhiquan Wan, Hangzhou (CN);
Jianliang Shen, Hangzhou (CN)

(73) Assignee: ZHEJIANG LAB, Hangzhou (CN)

( * ) Notice: Subject to any disclaimer, the term of this patent is extended or adjusted under 35 U.S.C. 154(b) by 0 days.

(21) Appl. No.: 18/328,797

(22) Filed: Jun. 5, 2023

(30) Foreign Application Priority Data

Jun. 30, 2022 (CN) .......................... 202210758528.X

(51) Int. Cl.
*H01L 23/00* (2006.01)
*H01L 23/538* (2006.01)

(52) U.S. Cl.
CPC ............ *H01L 24/81* (2013.01); *H01L 23/538* (2013.01); *H01L 23/5381* (2013.01);
(Continued)

(58) Field of Classification Search
CPC ......... H01L 24/11; H01L 24/14; H01L 24/81; H01L 2224/11462; H01L 2224/1403;
(Continued)

(56) References Cited

U.S. PATENT DOCUMENTS

| 9,768,133 B1 | 9/2017 | Wu |
| 2009/0014885 A1 | 1/2009 | Chen et al. |

(Continued)

FOREIGN PATENT DOCUMENTS

| CN | 109786264 A | 5/2019 |
| CN | 111477553 A | 7/2020 |

(Continued)

OTHER PUBLICATIONS

First Office Action(CN202210758528.X); dated Aug. 15, 2022.
Notice Of Allowance(CN202210758528.X); dated Sep. 15, 2022.

*Primary Examiner* — Marcos D. Pizarro
(74) *Attorney, Agent, or Firm* — W&G Law Group

(57) ABSTRACT

A system-on-wafer structure and a fabrication method. The structure includes a wafer substrate, an integrated chiplet, a system configuration board and a thermal module. The wafer substrate and the integrated chiplet are bonded through a wafer micro bump array and a chiplet micro bump array. The wafer substrate and the system configuration board are bonded through a copper pillar array on wafer substrate topside and a pad on system configuration board backside. A molding layer is provided between the wafer substrate and the system configuration board, and is configured to mold the wafer substrate, the integrated chiplet and the copper pillar array. Integrated chiplet are electrically connected to each other through a re-distributed layer in wafer substrate. The integrated chiplet is electrically connected to the system configuration board through the re-distributed layer and the copper pillar array. The thermal module is attached to the backside of the wafer substrate.

6 Claims, 3 Drawing Sheets

(52) U.S. Cl.
CPC ...... *H01L 23/5382* (2013.01); *H01L 23/5389* (2013.01); *H01L 24/11* (2013.01); *H01L 24/14* (2013.01); *H01L 2224/11462* (2013.01); *H01L 2224/1403* (2013.01); *H01L 2224/145* (2013.01); *H01L 2224/14131* (2013.01)

(58) Field of Classification Search
CPC ..... H01L 2224/14131; H01L 2224/145; H01L 23/538; H01L 23/5381; H01L 23/5382; H01L 23/5389
See application file for complete search history.

(56) References Cited

U.S. PATENT DOCUMENTS

| | | | |
|---|---|---|---|
| 2020/0091215 A1* | 3/2020 | Jang | H01L 27/14636 |
| 2023/0076184 A1* | 3/2023 | Shim | H01L 23/49822 |
| 2023/0230923 A1* | 7/2023 | Pasdast | H01L 23/5382 |
| | | | 257/668 |

FOREIGN PATENT DOCUMENTS

| | | |
|---|---|---|
| CN | 111508934 A | 8/2020 |
| CN | 111554641 A | 8/2020 |
| CN | 113066771 A | 7/2021 |
| TW | 201923866 A | 6/2019 |

\* cited by examiner

SYSTEM-ON-WAFER STRUCTURE AND FABRICATION METHOD

CROSS-REFERENCE TO RELATED APPLICATIONS

The present application claims priority to Chinese Patent Application No. 202210758528.X, filed on Jun. 30, 2022, the content of which is incorporated herein by reference in its entirety.

TECHNICAL FIELD

The present disclosure relates to the technical field of integrated circuit and in particular, to a system-on-wafer structure and fabrication method.

BACKGROUND

With the integrated circuit industry stepping into the Post-Moore's Law era, advanced integrated packaging technology has gradually become the R&D hot spot. In More than Moore, advanced packaging technology is used to optimize the system performance at the system architecture level. Die-to-die interconnect is used to assemble multiple die or module together to form a SiP chip module, such as EMIB and CoWoS technologies. In 2021, Taiwan Semiconductor Manufacturing Company (TSMC) further applied system integration technology to wafer level and released InFO SoW (Integrated Fan Out System on Wafer) technology, Cerebras and Tesla also released WSE (Wafer Scale Engine) and Tesla Dojo products, respectively, for a high-performance artificial intelligent computing system.

At present, a system on wafer (SoW) mainly relies on a single process node on a wafer to directly prepare multiple die on wafer and interconnect the die, and then fan out system signal by vertical interconnect technology, such as TSV (Through Silicon Via), thereby forming a very large chip, such as Cerebras WSE and Tesla Dojo. This method is a great challenge for the yield of semiconductor process. Once the chip on the wafer show a defect, the entire system may fail. At the same time, the high-density TSV also causes great trouble to the reliability of the wafer.

SUMMARY

In order to solve the above technical problems in the prior arts, the present disclosure proposes a system-on-wafer structure and fabrication method, which is capable of effectively improving the yield and reliability of a system-on-wafer (SoW). The specific technical solutions are as follows:

A SoW structure includes a wafer substrate, an integrated chiplet, a system configuration board and a thermal module.

A re-distributed layer is provided at the top of the wafer substrate, a bonding region formed by a wafer micro bump array is provided on the topside of the wafer substrate, and a copper pillar array formed by a copper pillar pad and a copper pillar is provided around the bonding region.

A chiplet micro bump array is provided on the backside of the integrated chiplet, and corresponds to the wafer micro bump array of the bonding region on the topside of the wafer substrate.

A configuration controller and a connector are integrated on the system configuration board, and a pad is provided on the backside of the system configuration board.

The wafer substrate and the integrated chiplet are bonded in the bonding region through the wafer micro bump array and the chiplet micro bump array. The wafer substrate and the system configuration board are bonded through the copper pillar array and the pad on system configuration board. A molding layer is provided between the wafer substrate and the system configuration board, and is configured to mold the wafer substrate, the integrated chiplet bonded to the wafer substrate, and the copper pillar array. Integrated chiplets are electrically connected to each other through the re-distributed layer. The system configuration board is electrically connected to the integrated chiplet through the re-distributed layer and the copper pillar array. The thermal module is attached to the backside of the wafer substrate.

In an embodiment, the wafer substrate is a semiconductor wafer, and the wafer substrate includes wafers of Si, SiC and GaN semiconductor materials, with a size greater than or equal to 8 inches and a thickness between 300 μm and 1000 μm.

In an embodiment, a height of the copper pillar is greater than or equal to 100 μm, and a diameter-height ratio of the copper pillar is between 1:1 and 1:2.

In an embodiment, the area of the bonding region is less than the maximum area of a primary patterning region. The maximum area of the primary patterning region consists of the area of the bonding region and the area occupied by the copper pillar array around the bonding region, and bonding regions are arranged at an interval with a spacing of each bonding region greater than or equal to 100 μm.

In an embodiment, the integrated chiplet is a heterogeneous chiplet. The area of the integrated chiplet is less than or equal to the maximum area of the primary patterning region, and a thickness of the integrated chiplet is less than or equal to 150 μm.

In an embodiment, the system configuration board is a Printed Circuit Board (PCB) board, and the configuration controller is configured for power supplying, testing and system configuration for the integrated chiplet.

In an embodiment, the thermal module includes an air cooling module, a liquid cooling module and a microchannel cooling module.

A SoW fabrication method for a SoW structure includes the following steps.

Step S1, after performing multiple patterning operations on a wafer substrate, a plurality of primary patterning regions are formed on the surface of the wafer substrate. The patterning operations specifically include: forming a re-distributed layer, a wafer micro bump array and a copper pillar pad on the top of the wafer substrate through a semiconductor front-end/back-end metal process. A bonding region on the surface of the wafer substrate is formed by the wafer micro bump array.

Step S2, an integrated chiplet is bonded with the wafer substrate through a Chip to Wafer (C2 W) bonding process to from an integrated wafer.

Step S3, deposit a thick photoresist film on the top of an integrated wafer with a thickness greater than or equal to 100 μm, then etch the thick photoresist film to form a deep hole for cupper pillar deposition.

Step S4, the copper pillar is formed at the copper pillar hole etched in the step S3 through an electroplating process.

Step S5, after removing the photoresist, the integrated wafer is molded to form a molding layer, and then the molding layer is thinned to reveal the copper pillar.

Step S6, the copper pillar is aligned and bonded with a pad on the backside of the system configuration board, and then a thermal module is attached at the bottom of the integrated wafer to complete a SoW structure.

Beneficial effects of the present disclosure are as follows.

By the SoW structure according to the present disclosure, the wafer substrate, the integrated chiplet, the system configuration board and the thermal module on the SoW can be integrated with high density. The problem of the yield of SoW preparation can be solved by a C2W bonding process. Special SoW for different arts can be obtained by changing the types of the integrated chiplet. The integrated chiplet and the system configuration board can be connected to each other through the copper pillar on the wafer substrate, thereby solving the problem of wafer reliability caused by high density TSV and making significant contribution for the development of the SoW.

Reference signs: 1-wafer substrate, 2-integrated chiplet, 3-copper pillar, 4-thermal module, 5-system configuration board, 6-configuration controller, 7-connector, 8-pad, 9-molding layer, 10-copper pillar pad, 11-re-distributed layer, 12-chiplet micro bump array, 13-wafer micro bump array, 14-bonding region, 15-primary patterning region, 16-photoresist layer, 17-copper pillar hole.

DESCRIPTION OF EMBODIMENTS

In order to make the purpose, technical solution and technical effects of the present disclosure more clear, the present disclosure is further described in detail below in combination with the drawings and embodiments of the specification.

Figure 1:
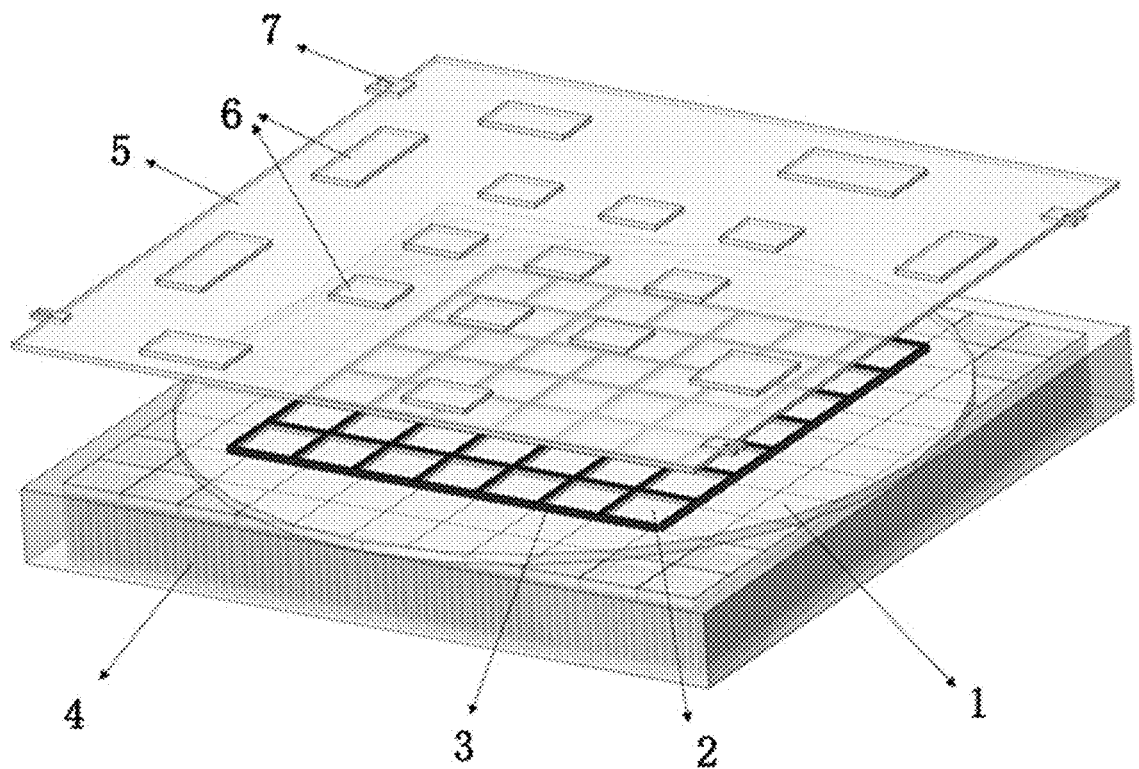
FIG. 1 is a schematic diagram of a SoW structure according to the present disclosure.

As shown in FIG. 1, a system-on-wafer (SoW) structure includes a wafer substrate 1, an integrated chiplet 2, a system configuration board 5 and a thermal module 4.

Figure 2:
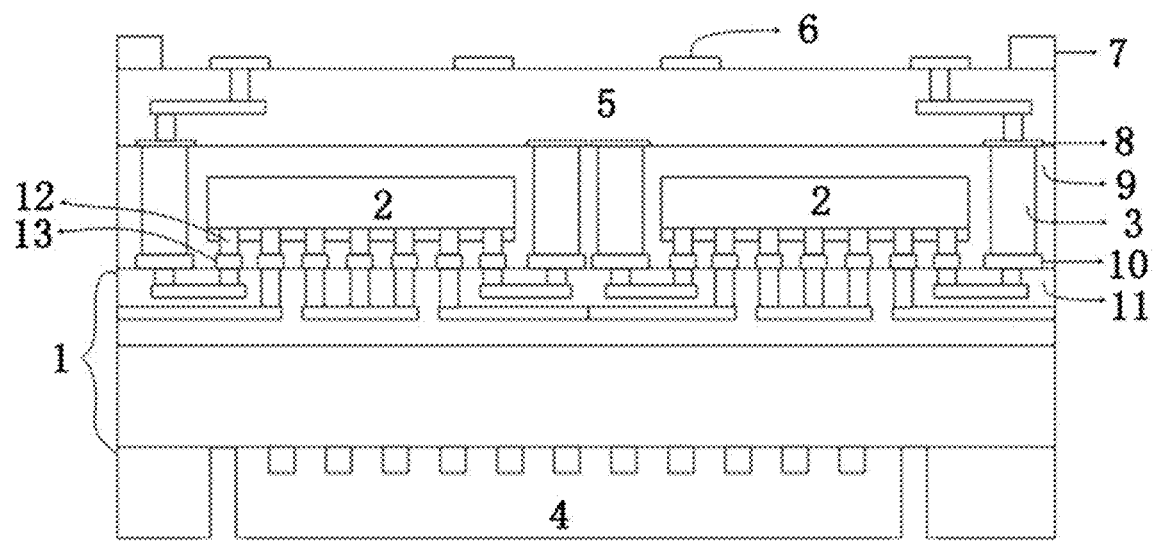
FIG. 2 is a cross-section diagram of a SoW structure according to the present disclosure.
Figure 3:
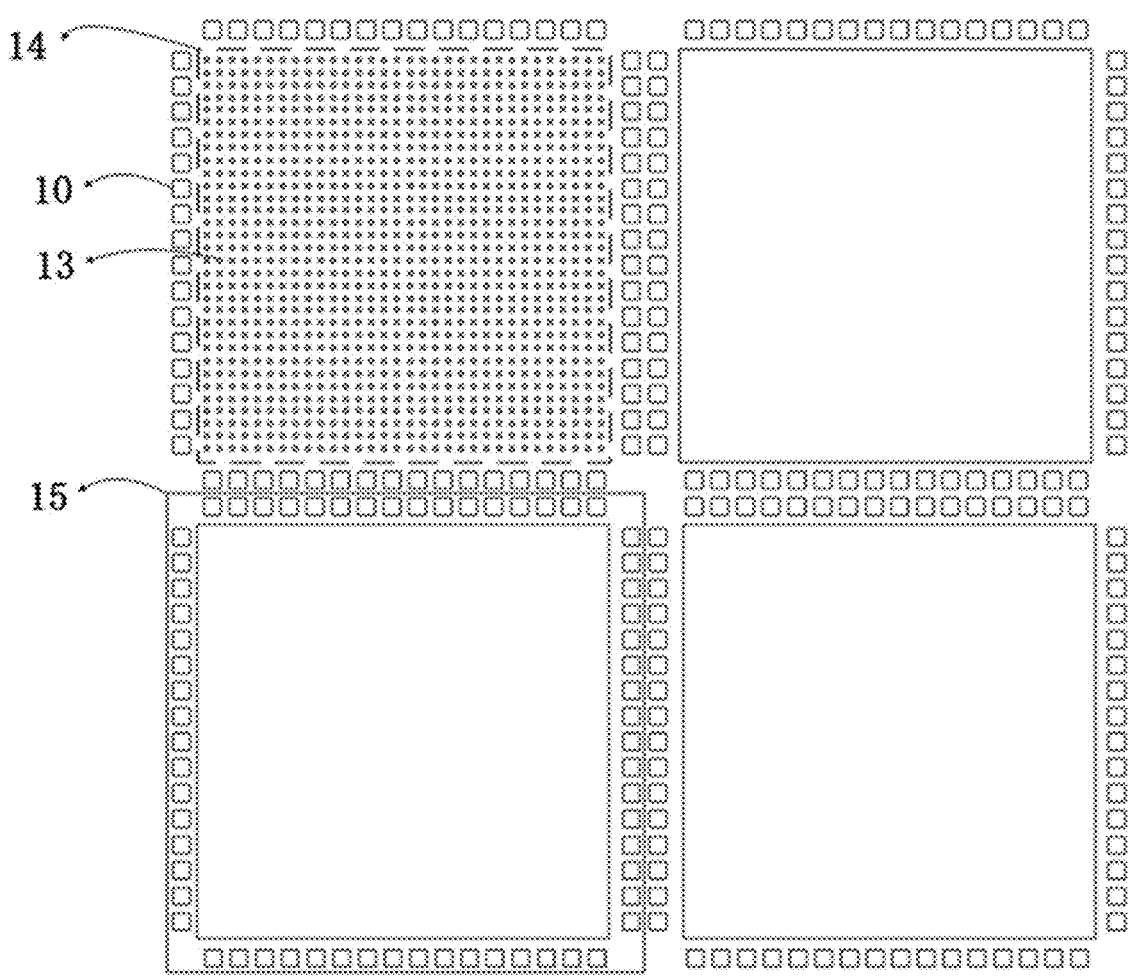
FIG. 3 is a schematic diagram of a topside of a wafer substrate of a system on wafer according to the present disclosure.
Figure 4:
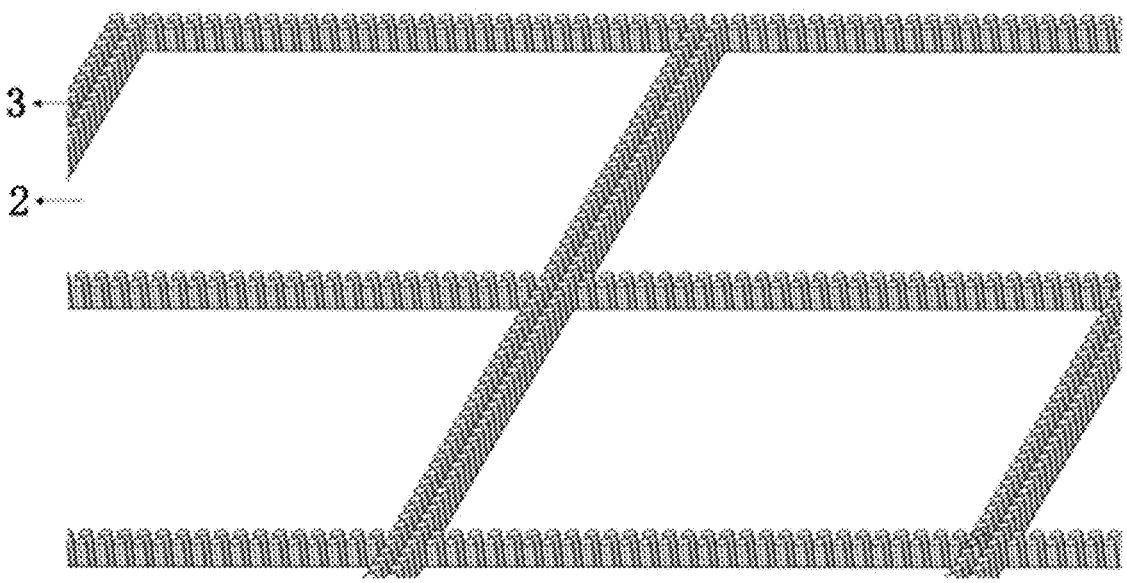
FIG. 4 is a schematic diagram of an integrated chiplet and a copper pillar of a SoW according to the present disclosure.

As shown in FIG. 2, a re-distributed layer 11 (RDL) is provided at the top of the wafer substrate 1, a bonding region 14 formed by a wafer micro bump array 13 is provided on the topside of the wafer substrate 1, and a copper pillar array formed by connecting a copper pillar pad 10 and a copper pillar 3 is provided around the bonding region 14, as shown in FIGS. 3 and 4.

A chiplet micro bump array 12 is provided on the backside of the integrated chiplet 2, and corresponds to the wafer micro bump array 13 of the bonding region 14 on the topside of the wafer substrate 1.

A configuration controller 6 for a system on wafer and a connector 7 for external communication are integrated on the system configuration board 5, and a pad 8 is provided on the backside of the system configuration board 5.

The wafer substrate 1 and the integrated chiplet 2 are bonded in the bonding region 14 through the wafer micro bump array 13 on the topside of the wafer substrate 1 and the chiplet micro bump array 12 on the backside of the integrated chiplet 2. The wafer substrate 1 and the system configuration board 5 are bonded through the copper pillar array on the wafer substrate 1 and the pad 8 on the backside of the system configuration board 5. A molding layer 9 is provided between the wafer substrate 1 and the system configuration board 5, and is configured to mold the wafer substrate 1, the integrated chiplet 2 bonded to the wafer substrate 1 and the copper pillar array. Integrated chiplets 2 are electrically connected to each other through the re-distributed layer 11 of the wafer substrate 1. The integrated chiplet 2 is electrically connected to the system configuration board 5 through the re-distributed layer 11 and the copper pillar array at the wafer substrate 1. The system thermal module 4 is attached to the backside of the wafer substrate 1.

The wafer substrate 1 is a semiconductor wafer, and the wafer substrate 1 includes but not limited to wafers of Si, SiC and GaN semiconductor materials, with a size greater than or equal to 8 inch and a thickness between 300 μm and 1000 μm. In this embodiment, a silicon wafer with the thickness of 750 μm and the size of 12 inch is selected.

A height of the copper pillar of the wafer substrate 1 is greater than or equal to 100 μm, and a diameter-height ratio of the copper pillar is between 1:1 and 1:2. In this embodiment, a copper pillar with a height of 150 μm and a diameter-height ratio of 1:1 is selected.

Integrated chiplets 2 may be electrically connected to each other through the re-distributed layer 11 of the wafer substrate 1 after the chiplets are bonded.

The area of the bonding region 14, formed by the wafer micro bump array 13 on the topside of the wafer substrate 1, is less than the maximum area of a primary patterning region 15. The maximum area of the primary patterning region 14 consists of the area of the bonding region 14 and the area occupied by the copper pillar array around the bonding region 14. Bonding regions are arranged at an interval with a spacing greater than or equal to 100 μm. In the embodiment, a spacing of each bonding region is 400 μm.

The integrated chiplet 2 may be a heterogeneous chiplet. According to various integrated chiplets 2, special types of systems on wafer for different fields may be constructed. The area of the integrated chiplet 2 is less than or equal to the maximum area of the primary patterning region 15, and a thickness of the integrated chiplet 2 is less than or equal to 150 μm. In this embodiment, the integrated chiplet 2 is homogeneous switch chip, the area of the switch chip is equal to the area of the bonding region, and the thickness of the switch chip is 100 μm.

The system configuration board 5 is a PCB board, and the configuration chip 6 is configured to supply power for, test, and configure the system, for the integrated chiplet 2.

The thermal module 4 selects a variety of thermal assemblies, such as an air cooling module, a liquid cooling module and a microchannel cooling module, based on the power requirements of the SoW. In this embodiment, a liquid and microchannel cooling radiator is selected as the thermal module.

Figure 5:
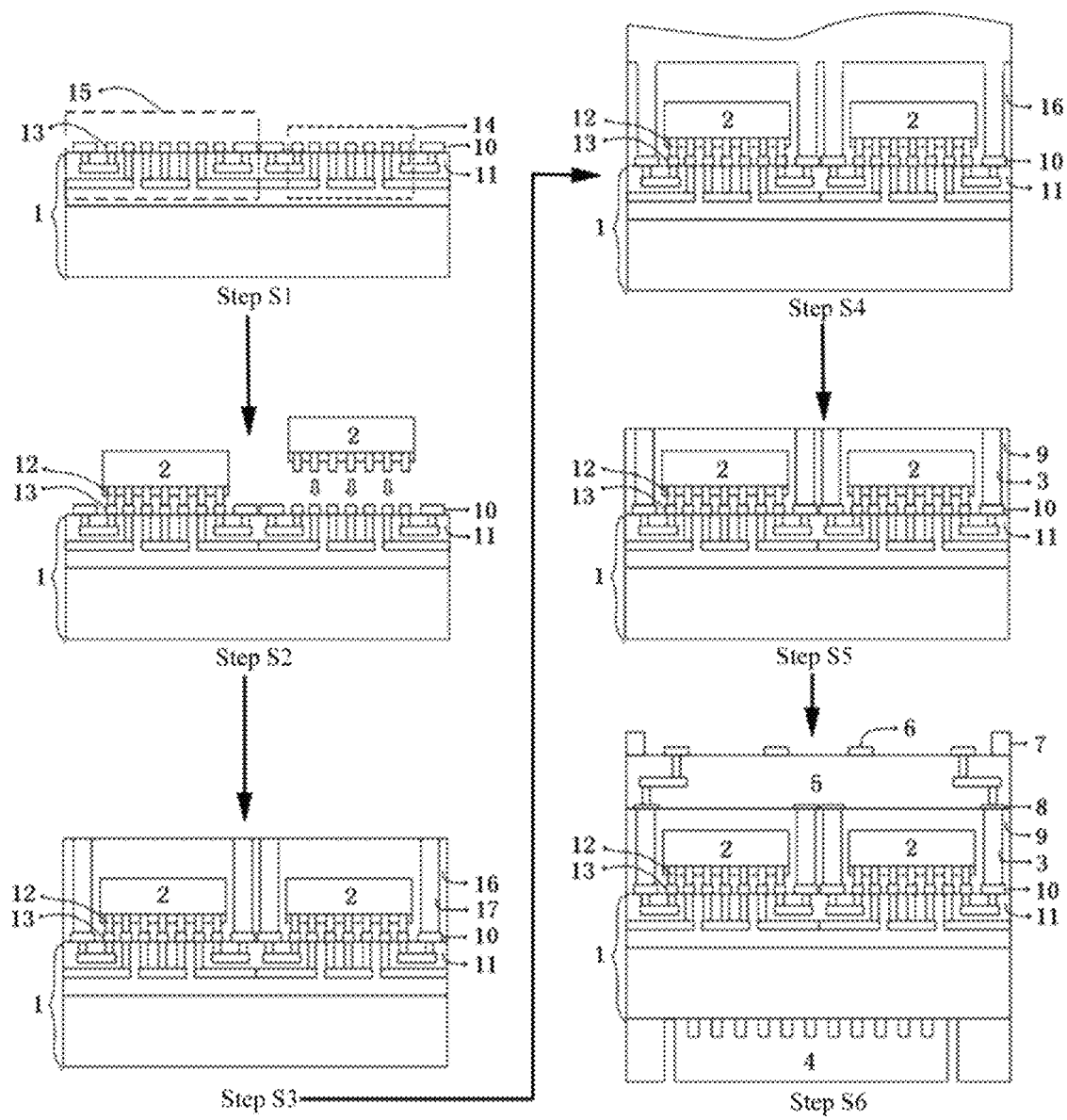
FIG. 5 is a schematic diagram of fabrication process for a SoW structure of the present disclosure.

As shown in FIG. 5, a SoW fabrication method for a SoW structure includes the following steps.

Step S1, after performing multiple patterning operations on a wafer substrate 1, a plurality of primary patterning regions 15 are formed on the surface of the wafer substrate 1. The patterning operations specifically include: forming a re-distributed layer 11, a wafer micro bump array 13 and a copper pillar gasket 10 at the top of the wafer substrate 1 through a semiconductor front-end/back-end metal process. A bonding region 14 on the surface of the wafer substrate 1 is formed by the wafer micro bump array 13.

Step S2, an integrated chiplet 2 is bonded with the wafer substrate 1 through a C2 W bonding process to from an integrated wafer.

Step S3, depositing a thick photoresist film on the top of an integrated wafer with a thickness greater than or equal to 100 and then etching the thick photoresist film to form a deep hole for cupper pillar deposition.

Step S4, the copper pillar 3 is formed at the copper pillar hole 17 etched in the Step S3 through an electroplating process. A height of the copper pillar 3 is 150 and a diameter-height ratio of the copper pillar 3 is 1:1.

Step S5, after removing the photoresist, the integrated wafer is molded to form a molding layer 9, and then the molding layer 9 is thinned to reveal the copper pillar. In this embodiment, the thickness of the plastic packaging layer 9 is reduced to 120 μm.

Step S6, the copper pillar 3 of the integrated wafer obtained in the step S5 is aligned and bonded with a pad 8 on the lower surface of the system configuration board 5, and then a thermal module 4 is attached at the bottom of the integrated wafer to complete a SoW structure. The thermal module 4 is selected based on the power coefficient on wafer.

The above are only preferred embodiments of the present disclosure and do not limit the present disclosure in any form. Although the implementation process of the present disclosure has been described in detail above, those skilled in the art are still capable of amending the technical solutions recorded in the above embodiments, or replacing some of the technical features equally. Any amendment and equivalent replacement made within the spirit and principle of the present disclosure shall fall into the protection scope of the present disclosure.

What is claimed is:

1. A method for fabricating a system-on-wafer structure, wherein the system-on-wafer structure comprises: a wafer substrate, an integrated chiplet, a system configuration board, and a thermal module, wherein a re-distributed layer is provided at the top of the wafer substrate, a bonding region formed by a wafer micro bump array is provided on an topside of the wafer substrate, a copper pillar array formed by connecting a copper pillar pad and a copper pillar is provided around the bonding region, a chiplet micro bump array is provided on a backside of the integrated chiplet and corresponds to the wafer micro bump array of the bonding region on the topside of the wafer substrate, a configuration controller and a connector are integrated on the system configuration board, and a pad is provided on a backside of the system configuration board, the system configuration board is a Printed Circuit Board (PCB) board, the configuration controller is configured for power supplying, testing and system configuration of the integrated chiplet, the wafer substrate and the integrated chiplet are bonded in the bonding region through the wafer micro bump array and the chiplet micro bump array, the wafer substrate and the system configuration board are bonded through the copper pillar array and the pad, a molding layer is provided between the wafer substrate and the system configuration board, and is configured to mold the wafer substrate, the integrated chiplet bonded to the wafer substrate, and the copper pillar array, each integrated chiplet is electrically connected to each other through the re-distributed layer, the system configuration board is electrically connected to the integrated chiplet through the re-distributed layer and the copper pillar array, and the system thermal module is attached to a lower surface of the wafer substrate, and wherein the method comprises:

step S1, performing multiple patterning operations on the wafer substrate to form a plurality of primary patterning regions on the surface of the wafer substrate, wherein the patterning operations comprise: forming the re-distributed layer, the wafer micro bump array and the copper pillar gasket at the top of the wafer substrate through a semiconductor front-end/back-end metal process, and wherein the bonding region on the wafer substrate is formed by the wafer micro bump array;

step S2, bonding the integrated chiplet with the wafer substrate through a Chip to Wafer (C2 W) bonding process to from an integrated wafer;

step S3, depositing a thick photoresist film on the top of an integrated wafer with a thickness greater than or equal to 100 μm, and etching the thick photoresist film to form a deep hole for cupper pillar deposition;

step S4, forming the copper pillar at the copper pillar hole etched in the step S3 through an electroplating process;

step S5, removing the photoresist, molding the integrated wafer to form the molding layer, and thinning the molding layer to reveal the copper pillar; and step S6, aligning and bonding the copper pillar with the pad on the backside of the system configuration board, and attaching the system thermal module at a bottom of the integrated wafer to complete the system-on-wafer structure.

2. The method according to claim 1, wherein the wafer substrate is a semiconductor wafer, and wherein the wafer substrate comprises wafers of Si, SiC and GaN semiconductor materials, with a size greater than or equal to 8 inch and a thickness between 300 μm and 1000 μm.

3. The method according to claim 1, wherein a height of the copper pillar is greater than or equal to 100 and a diameter-height ratio of the copper pillar is between 1:1 and 1:2.

4. The method according to claim 1, wherein the thermal module comprises an air cooling module, a liquid cooling module and a microchannel cooling module.

5. The method according to claim 1, wherein the area of the bonding region is less than a maximum area of a primary patterning region, the maximum area of the primary patterning region consists of an area of the bonding region and an area occupied by the copper pillar array around the bonding region, and bonding regions are arranged at an interval with a spacing greater than or equal to 100 μm.

6. The method according to claim 5, wherein the integrated chiplet is a heterogeneous chiplet, an area of the integrated chiplet is less than or equal to the maximum area of the primary patterning region, and a thickness of the integrated chiplet is less than or equal to 150 μm.

* * * * *